United States Patent
Eklund et al.

(10) Patent No.: US 7,694,531 B2
(45) Date of Patent: *Apr. 13, 2010

(54) METHOD AND APPARATUS FOR WAFER-LEVEL MICRO-GLASS-BLOWING

(75) Inventors: E. Jesper Eklund, Costa Mesa, CA (US); Andrei M. Shkel, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 663 days.

This patent is subject to a terminal disclaimer.

(21) Appl. No.: 11/526,436

(22) Filed: Sep. 25, 2006

(65) Prior Publication Data

US 2007/0071922 A1    Mar. 29, 2007

Related U.S. Application Data

(60) Provisional application No. 60/721,172, filed on Sep. 27, 2005.

(51) Int. Cl.
*C03B 19/10* (2006.01)
*B29D 22/00* (2006.01)
*B29D 22/04* (2006.01)

(52) U.S. Cl. .............................. 65/106; 65/21.1; 65/22; 264/41; 264/46.4; 264/500; 264/574

(58) Field of Classification Search ................... 264/41, 264/46.4, 5, 500, 572, 574; 428/34.6; 65/21.1, 65/22, 106, 142; 425/6, 461, 462, 463
See application file for complete search history.

(56) References Cited

U.S. PATENT DOCUMENTS 4,303,732 A * 12/1981 Torobin ...................... 428/333
4,404,717 A * 9/1983 Neubauer et al. ............. 28/107
2005/0214661 A1    9/2005 Stasiak et al.

OTHER PUBLICATIONS

Zhu, Zhenping et al., Molecular "Glass" Blowing: From Carbon Nanotubes to Carbon Nanobulbs, Advanced Materials, vol. 16, No. 5, Mar. 5, 2004, pp. 443-447, 2004 (abstract).
International Searching Authority, International Search Report and Written Opinion dated Jul. 11, 2007, 7 pages.

* cited by examiner

*Primary Examiner*—Steven P Griffin
*Assistant Examiner*—Cynthia Szewczyk
(74) *Attorney, Agent, or Firm*—Daniel L. Dawes; Marcus C. Dawes

(57) ABSTRACT

A method for forming microspheres on a microscopic level comprises the steps of defining holes through a substrate, disposing a sheet of thermally formable material onto the substrate covering the holes, heating the sheet of thermally formable material until a predetermined degree of plasticity is achieved, applying fluidic pressure through the holes to the sheet of thermally formable material, while the sheet of glass is still plastic, and forming microspheres on the substrate in the sheet of thermally formable material by means of continued application of pressure for a predetermined time. The invention also includes a substrate having a plurality of holes defined therethrough, a layer of thermally formable material disposed onto the substrate covering the plurality of holes, and a plurality of microspheres thermally formed in the layer by means of applied pressure through the holes when it has been heated to a predetermined degree of plasticity.

13 Claims, 4 Drawing Sheets

METHOD AND APPARATUS FOR WAFER-LEVEL MICRO-GLASS-BLOWING

RELATED APPLICATIONS

The present application is related to U.S. Provisional Patent Application, Ser. No. 60/721,172, filed Sep. 27, 2005, which is incorporated herein by reference and to which priority is claimed pursuant to 35 USC 119.

BACKGROUND OF THE INVENTION

1. Field of the Invention

The invention relates to the field of micromachined glass components and methods of manufacture of the same.

2. Description of the Prior Art

In addition to consumer glass products, glass-blowing is often used to create confinement chambers for different types of gases. A normal glass-blowing process is (roughly) as follows:

Heat the glass to its softening point
Remove glass from the heat source (e.g. flame)
Immediately apply pressure (blowing) to shape the glass
Repeat all steps if needed In the past, micro-spheres have been fabricated using polymer droplets that are allowed to fall through a high column whose temperature profile is controlled by independent heating units, allowing for expansion of the spheres. See R. Cook, "Creating Microsphere Targets for Inertial Confinement Fusion Experiments", Energy & Technology Review, pp. 1-9, April 1995; and R. Dagani, "Microspheres Play Role in Medical, Sensor, Energy, Space Technologies", Chemical and Engineering News, pp. 33-35, December 1994

However, all of these prior efforts have dealt with the fabrication of spheres that are not attached to any surface and can only be filled with specific gases during the fabrication process. Small confinement chambers can be achieved by etching (using dry or wet etchant) glass, silicon, or other materials. However, etching usually leads to rough surfaces as well as very thick sidewalls making it unfit for many applications (e.g. when optics need to be integrated with the chamber). Furthermore, it is not possible to achieve a spherical shape with traditional etching techniques. Large-scale confinement chambers have been created in the past using traditional glass-blowing techniques. However, conventional glass-blowing can only be used to create large components (not micro-fabrication compatible).

What is need is a method and apparatus where glass-blowing is performed in a parallel batch process on a microscopic level.

BRIEF SUMMARY OF THE INVENTION

The method of the illustrated embodiment allows for microfabrication compatible micro-glass-spheres, integrated on a substrate, wafer or chip. These spheres can be filled by gases or other substances post fabrication. In the illustrated embodiment of the invention, the spheres are attached to a wafer, allowing for integration with conventional micro-fabrication components and allowing for batch-fabrication of micro-glass components.

The invention includes a method for shaping glass on a microscopic scale to mass-produce multiple glass components, i.e. shaped simultaneously on a micro-scale. This is accomplished by bonding a thin sheet of glass to a perforated wafer, heating the glass, and then blowing the glass from the reverse side of the wafer. One potential application of this invention is as a confinement chamber for various gases. The chambers are much smaller than traditional glass-blown chambers and are micro-fabrication compatible.

The invention can be used as a microscopic gas confinement chamber. Many applications of this can be considered, e.g. nuclear magnetic resonance gyroscopes, micro-lamps, and hydrogen capsules for H-vehicles. Other possible applications include laser fusion targets, as well as lab-on-a-chip, medication capsules, and other biomedical devices.

More specifically, the illustrated embodiment of the invention is a method for glass-blowing on a microscopic level comprising the steps of defining holes through a substrate, such as a semiconductor or silicon substrate, wafer or chip, and disposing a sheet of thermally formable material, such as glass, onto the substrate covering the holes. The sheet of thermally formable material is heated, such as by a flame, until a predetermined degree of plasticity is achieved. It must be understood that many other forms of heating are contemplated within the scope of the invention, which are both localized to at least some extent to the thermally formable material, such as by a laser, or may be global, such as in an oven or heating chamber. Fluidic pressure is applied through the holes to the sheet of thermally formable material, while the sheet of glass is still plastic. Microspheres are formed or blown on the substrate in the sheet of thermally formable material by means of continued application of pressure for a predetermined time.

Preferably the holes are defined by etching using a deep-reactive ion etching (DRIE) method. The step of disposing a sheet of thermally formable material comprises bonding the thermally formable material to the substrate using anodic bonding. Again many other different kinds methods of bonding now known or later devised could be substituted for anodic bonding. In the illustrated embodiment the step of disposing a sheet of thermally formable material comprises bonding borosilicate glass to the substrate. The step of defining holes through the substrate comprises etching a plurality of holes through the substrate and forming microspheres on the substrate results in simultaneously batch fabricating the microspheres.

The illustrated embodiment of the method further comprises the step of fabricating integrated electrical and mechanical components on or into the substrate, wafer or chip using conventional microfabrication methods as are now known or as may be later devised as substitutes therefor.

In one embodiment the method further comprises the step of providing an assembly to sandwich the thermally formable material between two flanges. The assembly comprises a plurality of metal flanges with gaskets in between, screws or any other equivalent means for providing a tight seal between the flanges and the substrate, a valve, and a hose connected to the valve to allow for the blowing of the thermally formable material. The blowing of the microspheres is either manually performed or a pressure regulated gas tube is used with the assembly.

In another embodiment the method further comprises selectively heating of gases or other substances enclosed in the microspheres using a resistive heater integrated on the substrate.

In still another embodiment the method further comprises the step of disposing a gas-source material in a solid state in the microspheres and heating the gas-source material to produce a vapor inside the microspheres.

In one embodiment the method further comprises the step of reducing magnetic fields introduced by the resistive heater by using two very thin resistive layers in the heater in which the current flows in opposite directions, where the resistive layers are spaced apart by an insulating dielectric layer.

In still another embodiment the method further comprises the step of protecting portions of the thermally formable material that do not cover any holes with a layer of a material with a very high melting point to function as a heat shield during blowing and heating.

In the illustrated embodiment the resistive heater is made from a material that has a high melting temperature, and the method further comprises the step of protecting portions of the thermally formable material using the resistive heater as the heat-shield to reduce the risk of undesired deformation of selected areas of the thermally formable material when heated above its softening point.

In an embodiment the method further comprises the step of protecting portions of the thermally formable material comprises using a protective heat-shield separate from the heater.

The invention is also characterized as an apparatus comprising a substrate, wafer or chip having a plurality of holes defined therethrough, a layer or sheet of thermally formable material or glass disposed onto the substrate, wafer or chip covering the plurality of holes, and a plurality of microspheres thermally formed in the layer or sheet by means of applied pressure through the plurality of holes when the thermally formable material or glass has been heated to a predetermined degree of plasticity.

In a further embodiment the apparatus further comprises a selected gas, gases or other substances filling the plurality of microspheres as supplied through the plurality of holes.

In a further embodiment the plurality of holes are sealed from the back once the microspheres have been filled with gases or other substances. The seal is preferably created by using an adhesive or by anodically bonding a glass wafer to the back of the silicon wafer. Many other sealing methods now known or later devised could be equivalently substituted.

In other embodiments the apparatus further comprises an integrated electrical resistive heater disposed on the layer in thermal proximity to the plurality of microspheres.

In an illustrated embodiment the apparatus further comprises a heat shield selectively disposed on the substrate to shield selected portion of the substrate from heat applied to the microspheres.

In the illustrated embodiment the integrated electrical resistive heater is comprised of at least one high temperature resistant layer and functions as a heat shield selectively disposed on the substrate to shield selected portions of the substrate from heat applied to the microspheres.

It must also be understood that the apparatus in other embodiments further comprises at least one micromechanical or microelectrical device integrated into or onto the substrate.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

The illustrated embodiments of the invention was developed as a microscopic gas confinement chamber, but many other applications are expressly considered as within the scope of the invention, e.g. vapor cells for nuclear magnetic resonance gyroscopes, micro-lamps, and hydrogen capsules for H-vehicles. Other applications include laser fusion targets, as well as lab-on-a-chip, medication capsules, and other biomedical devices. This listing by no means exhausts the list of potential uses and applications of the invention.

Figure 1A:
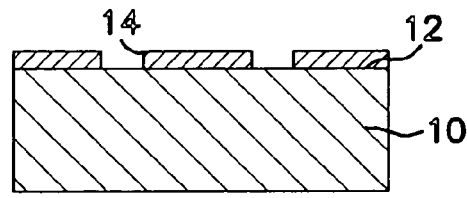
FIGS. 1a-1f are cross sectional diagrams illustrating a first embodiment of the method of the invention.
Figure 1B:
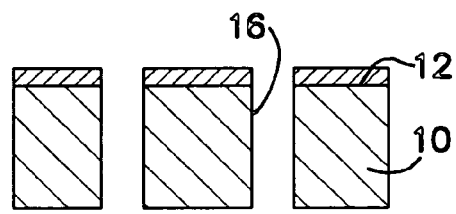
Figure 1C:
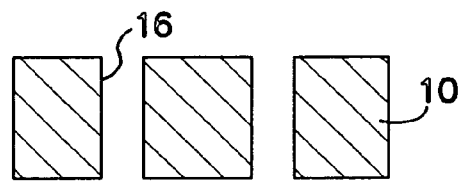
Figure 1D:
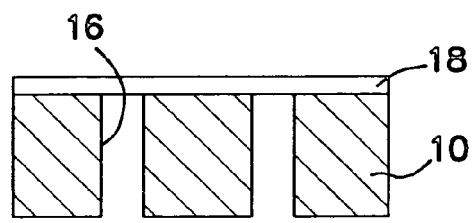
Figure 1E:
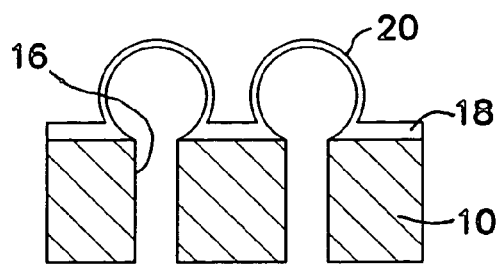

FIGS. 1a-1f depict the illustrated embodiment fabrication process. In FIG. 1a a photoresist layer 12 is disposed on a substrate 10 and patterned to define a plurality of openings 14 defined in photoresist layer 12. Cylindrical holes 16 are then etched in FIG. 1b all the way through a silicon substrate 10, preferably using deep-reactive ion etching (DRIE). The photoresist layer 12 is removed from the top of the perforated substrate 10 as shown in FIG. 1c. A thin sheet of glass 18 (e.g. Pyrex 7740) is then bonded as shown in FIG. 1d to on top of the substrate 10 (e.g. using anodic bonding), covering all of the etched holes 16. Glass sheet 18 is preferably 50 to 500 μm thick. In the illustrated embodiment a 100 μm thick glass sheet 18 was used. It must be expressly understood that the thickness of the sheet 18 is a matter of design chosen according to the teachings of the invention and are not to be understood as limited by the examples given in the illustrated embodiment. Heat (e.g. a flame) is applied from the top side to heat the glass 18 above its softening point. The source of heat is then removed and fluidic or pneumatic pressure is immediately applied from the bottom of the substrate 10. Small, approximately spherical bubbles or microspheres 20 in glass sheet 18 will now form on top of the substrate 10. The size and thickness of microspheres 20 can be selective controlled by the choice of the diameter and shape of the etched holes 16, the thickness of the glass sheet 18, and the time and pressure allowed for pneumatic expansion in the step of FIG. 1e.

Figure 1F:
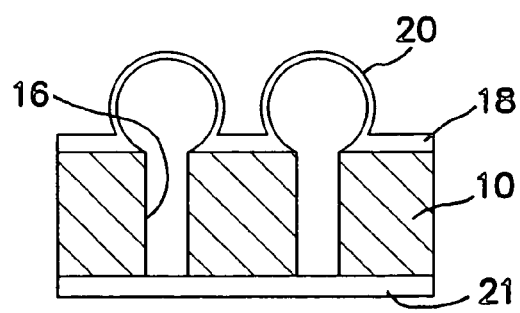

In the step of FIG. 1f a sealing layer 21 can be disposed on the bottom of substrate 10 sealing holes 16 to trap and maintain the gases or other materials that may have been injected or disposed into holes 16 and microspheres 20. The composition of layer 21 may be structured according to the needs of the application, including providing a selectively gas permeable or impermeable layer as might be required by the application.

Figure 2:
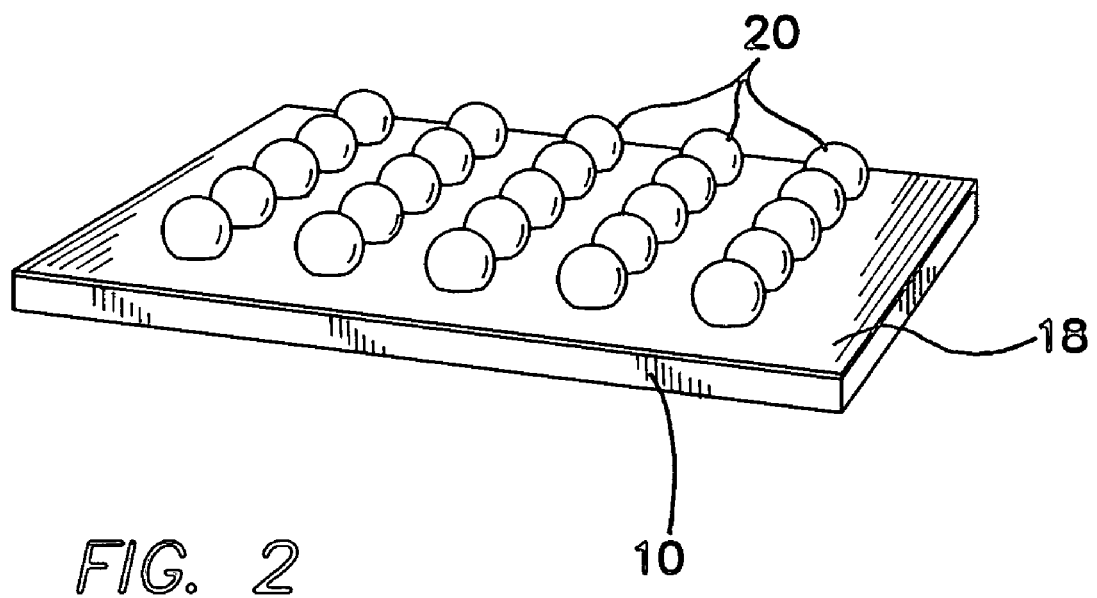
FIG. 2 is a perspective view of a glass covered substrate, wafer or chip on which a plurality of glass microspheres have been formed.

As shown in FIG. 2 multiple microspheres 20 can be batch fabricated simultaneously. The fabrication process also allows for potential integration of other electrical and mechanical components which may also fabricated on the substrate 10 using conventional microfabrication techniques.

Figure 3:
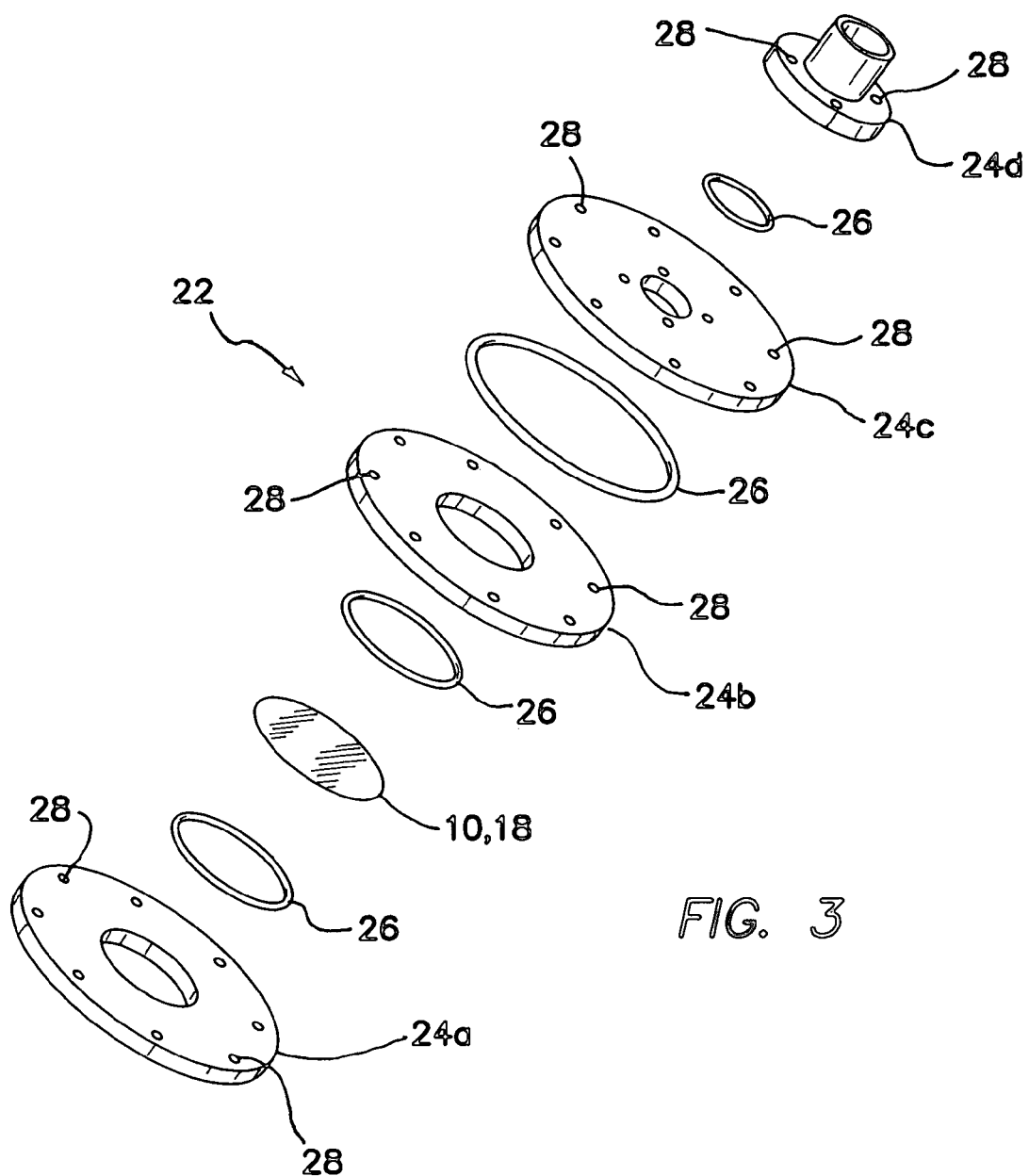
FIG. 3 is an exploded view of an assembly which is used in one embodiment to hold the substrate, wafer or chips during fabrication of the microspheres in a batch fabrication process.
Figure 4A:
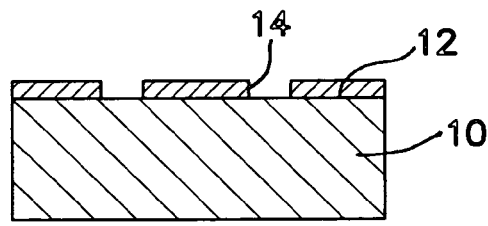
FIGS. 4a-4f are cross sectional diagrams illustrating another embodiment of the method of the invention in which a resistive heater/heat shield is used to heat gas in the microspheres and to selectively protect portions of the substrate, wafer or chips from heat applied to the microspheres and the glass layer from which they are formed.
Figure 4B:
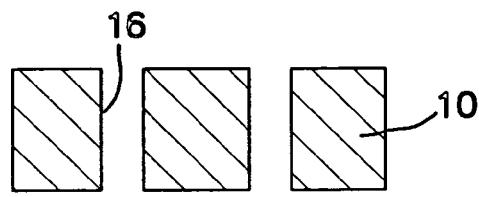
Figure 4C:
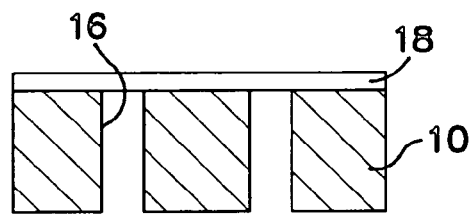
Figure 4D:
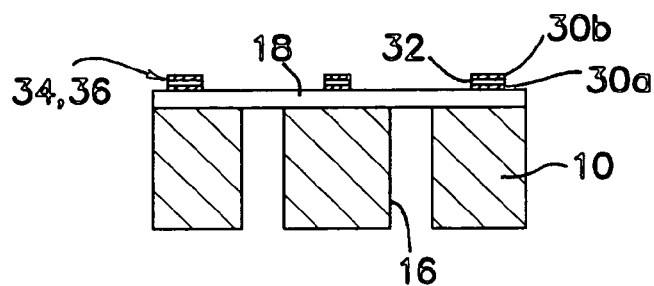
Figure 4E:
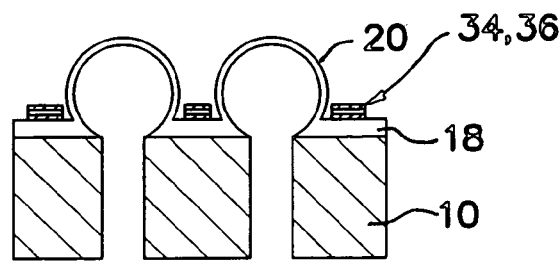
Figure 4F:
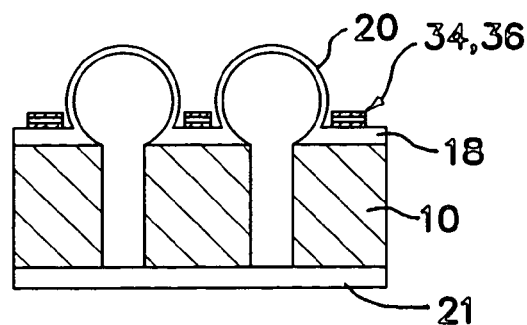

One assembly 22 that can be used to assist in the blowing of the microspheres 20 is illustrated in exploded view in FIG. 3. This assembly 22 can be characterized as a pressure chamber that can be used to sandwich the perforated, glass-covered substrate 10, 18 between two flanges 24a and 24b. The assembly 22 is comprised of a number of metal flanges 24a-24d with gaskets 26 in between. Screw-holes 28 are provided in flanges 24a-24d to allow for a tight connection and seal between the flanges 24a-24d and the glass covered substrate 10, 18. A hose (not shown) is connected to the valved flange 24d on top to allow for the actual blowing of the glass microspheres 20. The blowing is done either manually or using a pressure regulated gas tube (not shown).

FIGS. 4a-4f show a modified fabrication process. In this embodiment the steps are the same as in the case of FIGS. 1a-1f above, but in addition a resistive heater 34 is integrated on the substrate 10 at FIG. 4d, allowing for post-fabrication heating of the enclosed gases or other substances in microspheres 20 if needed. For example, materials that are in a solid state can be heated to achieve a vapor inside the microspheres 20. In order to reduce the magnetic fields introduced by the resistive heater 34, two very thin resistive layers 30a and 30b are used in which the current flows in opposite directions. The resistive layers 30a and 30b are spaced by an insulating dielectric 32. The actual shape of the resistive heater 34 is arbitrary, but preferentially it is a spiral that encircles an individual glass microsphere 20. The step in FIG. 4f includes the disposition of a sealing layer 21 on the bottom of substrate 10 in the same manner as described above in connection with FIG. 1f.

The glass sheet 18 needs to be heated above its softening point (e.g. by a flame) in order to be able to form the microspheres 20. However, due to the small size of the microspheres 20, localized heating is very hard to achieve. Instead, the whole substrate 10 will be heated simultaneously. Thus, areas that are supposed to stay bonded to the substrate 10 and not be affected by the glass-blowing will also be heated. In order to protect the parts of the glass sheet 18 that does not cover any holes 16, a layer of a material with a very high melting point can be deposited on top of the glass sheet 18. Many different materials may be used for this purpose, e.g. silicon dioxide, silicon nitride, or indium tin oxide (ITO), which is only a partial list of substitute materials. This material will function as a heat shield during the glass-blowing.

If the resistive heater 34 is made from a material that has a high melting temperature, e.g. ITO, this same layer or layers in heater 34 can also function as the heat-shield 36 to reduce the risk of undesired deformation of certain areas of the glass when it is heated to its softening point. Alternatively, separate independent layers are used for the heater 34 and the protective heat-shield 36.

In summary the illustrated embodiment encompasses within its scope a method of manufacture and the product made from the method as it relates to:

Glass-blowing on a microscopic level

Glass-blowing compatible with microfabrication technologies

Wafer-level glass-blowing

Method for fabricating microspheres

Simultaneous manufacturing of numerous microspheres on a chip or wafer

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following invention and its various embodiments.

Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations. A teaching that two elements are combined in a claimed combination is further to be understood as also allowing for a claimed combination in which the two elements are not combined with each other, but may be used alone or combined in other combinations. The excision of any disclosed element of the invention is explicitly contemplated as within the scope of the invention.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A method for glass-blowing on a microscopic level comprising:
   defining holes through a substrate, wherein defining the holes comprises etching the holes using deep-reactive ion etching (DRIE);
   disposing a sheet of thermally formable glass material onto the substrate to cover the holes;
   heating the sheet of thermally formable glass material until a predetermined degree of plasticity is achieved after the sheet of thermally formable glass material has been disposed onto the substrate;
   applying fluidic pressure through the holes to the sheet of thermally formable glass material, while the sheet of thermally formable glass material is still plastic; and
   forming microspheres on the substrate in the sheet of thermally formable glass material by means of continued application of pressure for a predetermined time.

2. The method of claim 1 where disposing a sheet of thermally formable glass material comprises bonding the thermally formable glass material to the substrate using anodic bonding.

3. The method of claim 1 where disposing a sheet of thermally formable glass material comprises bonding borosilicate glass to the substrate using anodic bonding.

4. The method of claim 1 further comprising microfabricating integrated electrical and mechanical components on or into the substrate.

5. The method of claim 1 further comprising selectively heating of gas, gases or other substances enclosed in the microspheres using a resistive micro-heater integrated on the substrate.

6. The method of claim 5 further comprising protecting portions of the thermally formable glass material using a protective heat-shield separate from the heater.

7. The method of claim 1 further comprising disposing a gas-source material in a solid state is disposed in the microspheres and heating the gas-source material to produce a vapor inside the microspheres.

8. The method of claim 1 further comprising sealing the microspheres by bonding a layer to a bottom of the substrate.

9. A method for glass-blowing microspheres on a microscopic level comprising:
   defining holes through a substrate;
   disposing a sheet of thermally formable glass material onto the substrate to cover the holes;
   heating the sheet of thermally formable glass material until a predetermined degree of plasticity is achieved;
   applying fluidic pressure through the holes to the sheet of thermally formable glass material, while the sheet of thermally formable glass material is still plastic; and
   forming microspheres on the substrate in the sheet of thermally formable glass material by means of continued application of pressure for a predetermined time,
   wherein defining holes through the substrate comprises etching a plurality of holes through the substrate and forming microspheres on the substrate comprises simultaneously batch fabricating the microspheres.

10. A method for glass-blowing microspheres on a microscopic level comprising:
    defining holes through a substrate;
    disposing a sheet of thermally formable glass material onto the substrate to cover the holes;
    heating the sheet of thermally formable glass material until a predetermined degree of plasticity is achieved;
    applying fluidic pressure through the holes to the sheet of thermally formable glass material, while the sheet of thermally formable glass material is still plastic;
    forming microspheres on the substrate in the sheet of thermally formable glass material by means of continued application of pressure for a predetermined time; and
    providing an assembly to sandwich the thermally formable glass material between two flanges, the assembly comprising a plurality of metal flanges with gaskets in between, screw means for providing a tight seal between the flanges and the substrate, a valve, a hose connected to the valve to allow for the blowing of the thermally formable glass material, wherein the blowing is either manually performed or a pressure regulated gas tube is used.

11. A method for glass-blowing microspheres on a microscopic level comprising:
    defining holes through a substrate;
    disposing a sheet of thermally formable glass material onto the substrate to cover the holes;
    heating the sheet of thermally formable glass material until a predetermined degree of plasticity is achieved;
    applying fluidic pressure through the holes to the sheet of thermally formable glass material, while the sheet of thermally formable glass material is still plastic;
    forming microspheres on the substrate in the sheet of thermally formable glass material by means of continued application of pressure for a predetermined time;
    selectively heating of gas, gases or other substances enclosed in the microspheres using a resistive micro-heater integrated on the substrate; and
    reducing magnetic fields introduced by the resistive micro-heater by using two very thin resistive layers in the heater in which the current flows in opposite directions, where the resistive layers are spaced apart by an insulating dielectric layer.

12. A method for glass-blowing microspheres on a microscopic level comprising:
    defining holes through a substrate;
    disposing a sheet of thermally formable glass material onto the substrate to cover the holes;
    heating the sheet of thermally formable glass material until a predetermined degree of plasticity is achieved;
    applying fluidic pressure through the holes to the sheet of thermally formable glass material, while the sheet of thermally formable glass material is still plastic;
    forming microspheres on the substrate in the sheet of thermally formable glass material by means of continued application of pressure for a predetermined time; and
    protecting portions of the thermally formable glass material that do not cover any holes with a layer of a material with a very high melting point to function as a heat shield during blowing and heating.

13. A method for glass-blowing microspheres on a microscopic level comprising:
    defining holes through a substrate;
    disposing a sheet of thermally formable glass material onto the substrate to cover the holes;
    heating the sheet of thermally formable glass material until a predetermined degree of plasticity is achieved;
    applying fluidic pressure through the holes to the sheet of thermally formable glass material, while the sheet of thermally formable glass material is still plastic;
    forming microspheres on the substrate in the sheet of thermally formable glass material by means of continued application of pressure for a predetermined time; and selectively heating of gas, gases or other substances enclosed in the microspheres using a resistive micro-heater integrated on the substrate, wherein the resistive micro-heater is made from a material that has a high melting temperature, and further comprising protecting portions of the thermally formable glass material using the resistive heater as the heat-shield to reduce the risk of undesired deformation of selected areas of the thermally formable glass material when heated to its softening point.

* * * * *